United States Patent
McLeod et al.

(10) Patent No.: US 8,891,704 B2
(45) Date of Patent: Nov. 18, 2014

(54) TRANSIMPEDANCE AMPLIFIER WITH EQUALIZATION

(71) Applicant: Fujitsu Limited, Kanagawa (JP)

(72) Inventors: Scott McLeod, Los Gatos, CA (US); Nikola Nedovic, San Jose, CA (US)

(73) Assignee: Fujitsu Limited, Kawasaki-shi (JP)

( * ) Notice: Subject to any disclaimer, the term of this patent is extended or adjusted under 35 U.S.C. 154(b) by 0 days.

(21) Appl. No.: 13/670,219

(22) Filed: Nov. 6, 2012

(65) Prior Publication Data

US 2014/0126622 A1    May 8, 2014

(51) Int. Cl.
*H03D 1/06* (2006.01)

(52) U.S. Cl.
USPC ............ 375/348; 375/295; 375/316; 375/340; 375/342; 375/347

(58) Field of Classification Search
USPC ......... 375/260, 269, 271, 295, 299, 316, 329, 375/330, 340, 342, 347, 348, 350
See application file for complete search history.

(56) References Cited

U.S. PATENT DOCUMENTS

| | | | | |
|---|---|---|---|---|
| 8,483,267 B2 * | 7/2013 | Momtaz | | 375/233 |
| 8,520,785 B2 * | 8/2013 | He | | 375/350 |
| 2006/0261892 A1 * | 11/2006 | Sutardja | | 330/253 |
| 2009/0103927 A1 * | 4/2009 | Cunningham et al. | | 398/139 |
| 2010/0066450 A1 * | 3/2010 | Palmer et al. | | 330/261 |
| 2010/0272448 A1 * | 10/2010 | Kubo | | 398/202 |
| 2010/0289584 A1 * | 11/2010 | Aroca et al. | | 330/260 |
| 2012/0224868 A1 * | 9/2012 | Proesel et al. | | 398/208 |
| 2013/0071109 A1 * | 3/2013 | Khatana et al. | | 398/38 |
| 2013/0188963 A1 * | 7/2013 | Afriat et al. | | 398/135 |
| 2013/0216241 A1 * | 8/2013 | Proesel et al. | | 398/213 |

* cited by examiner

*Primary Examiner* — Hirdepal Singh
(74) *Attorney, Agent, or Firm* — Baker Botts L.L.P.

(57) ABSTRACT

In one embodiment, a method includes applying, by a transimpedance amplifier at a receiving end of a communication link, equalization to a signal carried by the communication link at the receiving end of the communication link.

20 Claims, 14 Drawing Sheets

TRANSIMPEDANCE AMPLIFIER WITH EQUALIZATION

TECHNICAL FIELD

This disclosure generally relates to high-speed circuits.

BACKGROUND

A transimpedance amplifier is an amplifier that converts current to voltage. A transimpedance amplifier may include an amplifier and a feedback resistor. A transimpedance amplifier can be used as a receiver for optical communication to convert an electrical current generated by a photodiode to a voltage signal for further processing.

An equalization circuit may adjust a relative amplitude of frequency components of an electrical signal. For example, an equalization circuit may adjust an electrical signal carried over a communication channel such that a frequency response of the communication channel is substantially flat over a specified range of frequency.

SUMMARY

Particular embodiments relate to applying equalization to a high-speed signal with a transimpedance amplifier to reduce inter-symbol interference and jitter. Particular embodiments also relate to adaptively adjusting the equalization by adjusting one or more controllable elements of the transimpedance amplifier.

The object and advantages of the invention will be realized and attained at least by the elements, features, and combinations particularly pointed out in the claims. It is to be understood that both the foregoing general description and the following detailed description are exemplary and explanatory and are not restrictive of the invention, as claimed.

DESCRIPTION OF EXAMPLE EMBODIMENTS

Figure 1:
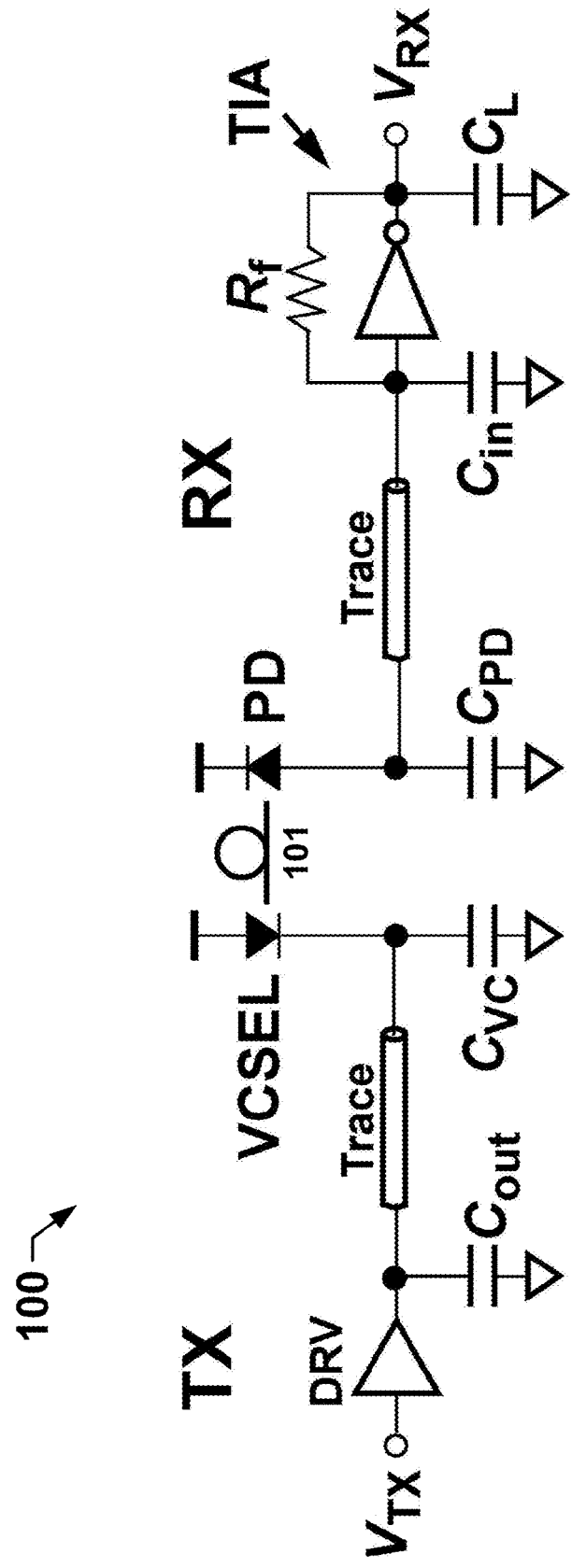
FIG. 1 illustrates an example optical link.

FIG. 1 illustrates an example optical link 100. In the example of FIG. 1, circuits at the transmitting side (TX) and circuits at the receiving side (RX) are coupled by an optical communication medium 101. Optical communication medium 101 may comprise one or more optical fibers or waveguides. A drive circuit (DRV) may amplify a voltage signal $V_{TX}$ and transmit the amplified voltage signal, or an amplified current signal, to a vertical-cavity surface-emitting laser (VCSEL). The VCSEL may convert the amplified voltage or current signal to an optical signal that is transmitted via optical communication medium 101 to circuits at the receiving side. This disclosure contemplates any suitable circuits that convert the amplified voltage or current signal to an optical signal. In the example of FIG. 1, $C_{OUT}$ denotes an output capacitance for the drive circuit. $C_{VC}$ denotes an input capacitance for the VCSEL. Trace at the transmitting side denotes one or more connecting traces within one or more circuit packages and printed circuit boards traversed by the amplified voltage signal. Trace at the transmitting side may comprise numerous parasitic components (e.g., resistance, inductance, capacitance) associated with the connecting traces, circuit packages, and printed circuit boards traversed by the amplified voltage signal.

At the receiving side of optical link 100, a photodiode (PD) may convert the optical signal transmitted from optical communication medium 101 to a current signal. This disclosure contemplates any suitable circuits that convert an optical signal to a current signal. A transimpedance amplifier (TIA) may convert and amplify the current signal to a received signal $V_{RX}$ in voltage. In the example of FIG. 1, the transimpedance amplifier may comprise an inverter and a feedback resistor $R_f$. In the example of FIG. 1, $C_{PD}$ denotes an output capacitance for the photodiode. $C_{in}$ and $C_L$ denote, respectively, an input capacitance and a load capacitance for the transimpedance amplifier. Trace at the receiving side denotes one or more connecting traces within one or more circuit packages and printed circuit boards traversed by the current signal. Traces at the receiving side may comprise numerous parasitic components (e.g., resistance, inductance, capacitance) associated with the connecting traces, circuit packages, and printed circuit boards traversed by the current signal.

Although optical communication medium 101 may have a large bandwidth-distance product, inter-symbol interference (ISI) and jitter may be introduced into the received signal $V_{RX}$ due to limited operational bandwidths of other components of optical link 100 (e.g., VCSEL, the photo diode, input and load capacitances, and parasitic components associated with the connecting traces, packages, and printed circuit boards at both transmitting and receiving sides). The aggregate bandwidth of the overall optical link 100 may further degrade the quality of signal transmission as data rates of signals carried by optical link 100 increases (e.g., above 25 Gb/s). Particular embodiments describe methods for improving the overall bandwidth of an optical link and bit error rate of signals carried by the optical link by applying equalization to the carried signals. Particular embodiments may apply equalization with a transimpedance amplifier at the receiving side of the optical link such that all bandwidth impairments preceding the receiving end may be canceled by the equalization. In particular embodiments, the transimpedance amplifier may amplify and apply equalization to the carried signals based on its adjustable frequency-dependent transfer function.

Figure 2:
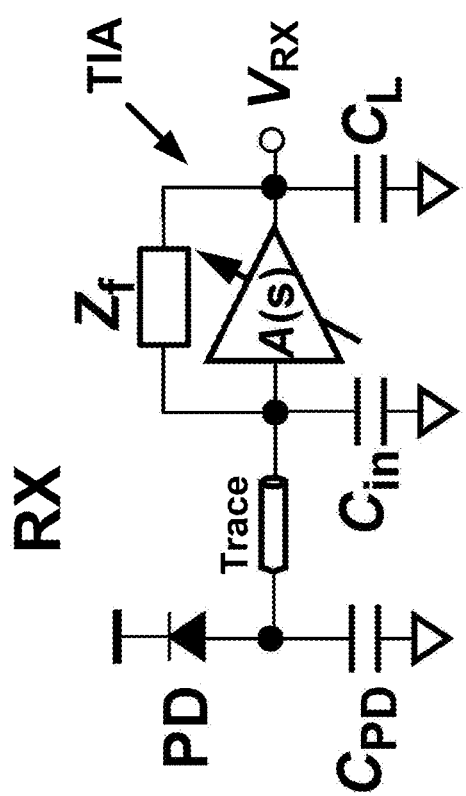
FIG. 2 illustrates the receiving side of an example optical link.

FIG. 2 illustrates the receiving side (RX) of the example optical link 100 illustrated in FIG. 1. As described with FIG. 1, the photodiode (PD) may convert an optical signal from optical communication medium 101 to a current signal. A transimpedance amplifier (TIA) may convert and amplify the current signal to a received signal $V_{RX}$. In particular embodiments, the transimpedance amplifier may comprise an amplifier and a feedback impedance $Z_f$. In particular embodiments, a gain of the amplifier or the amplifier gain A(s) is frequency dependent. For example, the amplifier gain A(s) may be represented in frequency domain (e.g., in s-domain) by equation (1) as following:

$$A(s) = A_0 \cdot \frac{1 + S/\omega_Z}{(1 + S/\omega_{p1})(1 + S/\omega_{p2})} \quad (1)$$

In equation (1), $A_0$ represents a direct-current (DC) gain; $\omega_Z$ represents a frequency for a zero in s-domain; and $\omega_{p1}$ and $\omega_{p2}$ represent respective frequencies of a first pole and a second pole in s-domain. Corresponding to the amplifier gain A(s), a transfer function $Z_{TIA}(s)$ of transimpedance amplifier 200 may be represented in s-domain by equation (2) as following:

$$Z_{TIA}(s) = -Z_f \cdot \frac{A(s)}{1 + A(s) + sZ_f C_{in}} \quad (2)$$

Figure 3A:
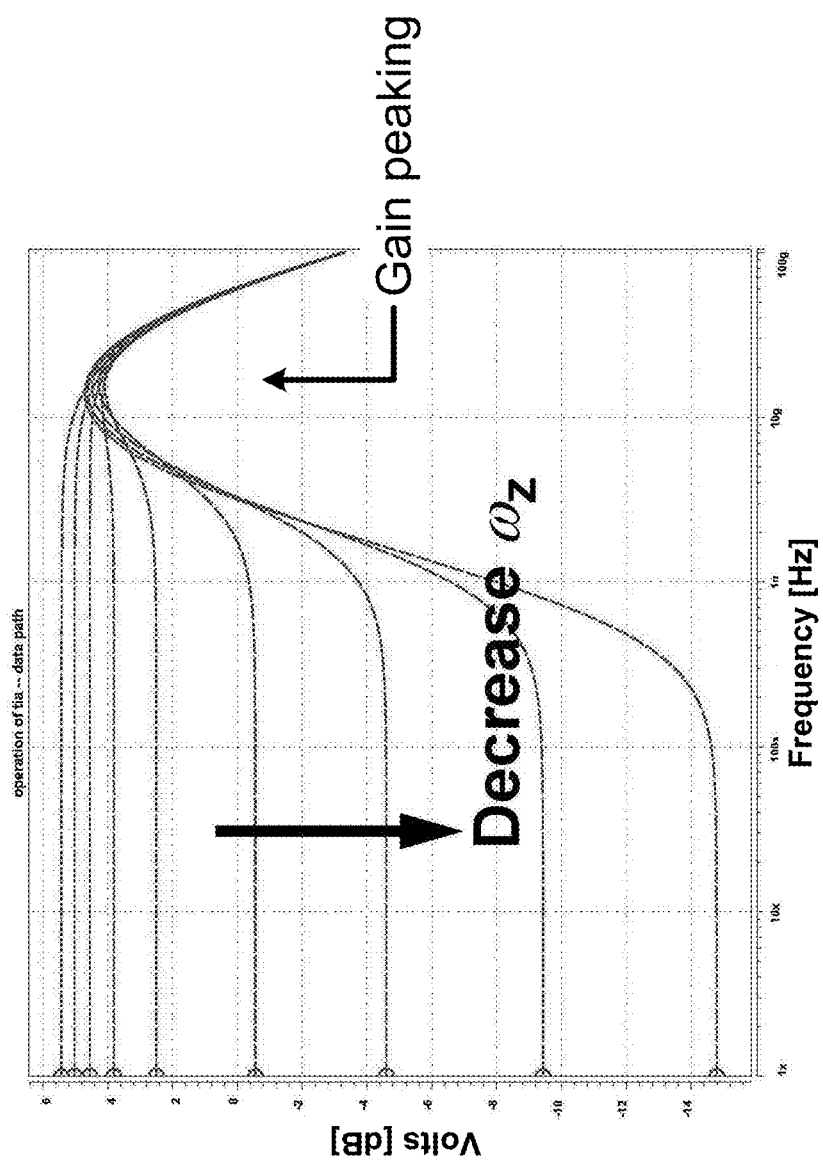
FIGS. 3A and 3B illustrate example amplifier gain and transfer function of a transimpedance amplifier.
Figure 3B:
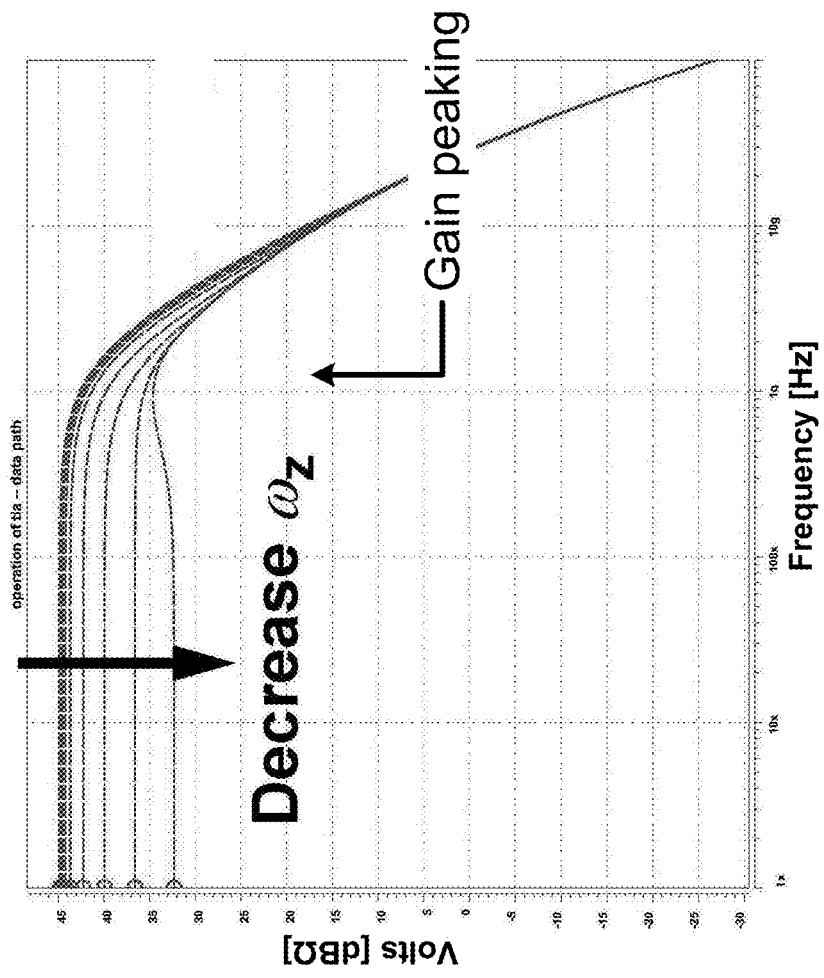

In particular embodiments, the transfer function $Z_{TIA}(s)$ may be adapted to provide gain peaking by varying one or more locations (i.e., frequencies) of one or more zeros or poles of the amplifier gain A(s) in frequency domain (e.g., s-domain). FIG. 3A illustrates an example amplifier gain A(s) with respect to decreasing zero frequency $\omega_Z$. In the example of FIG. 3A, decreasing zero frequency $\omega_Z$ may reduce DC gain (compared to gain at higher frequency), thus causing more gain peaking at higher frequency for the example amplifier gain A(s). Correspondingly, decreasing zero frequency $\omega_Z$ may cause more gain peaking at higher frequency for the transfer function $Z_{TIA}(s)$, as illustrated in FIG. 3B.

Figure 3C:
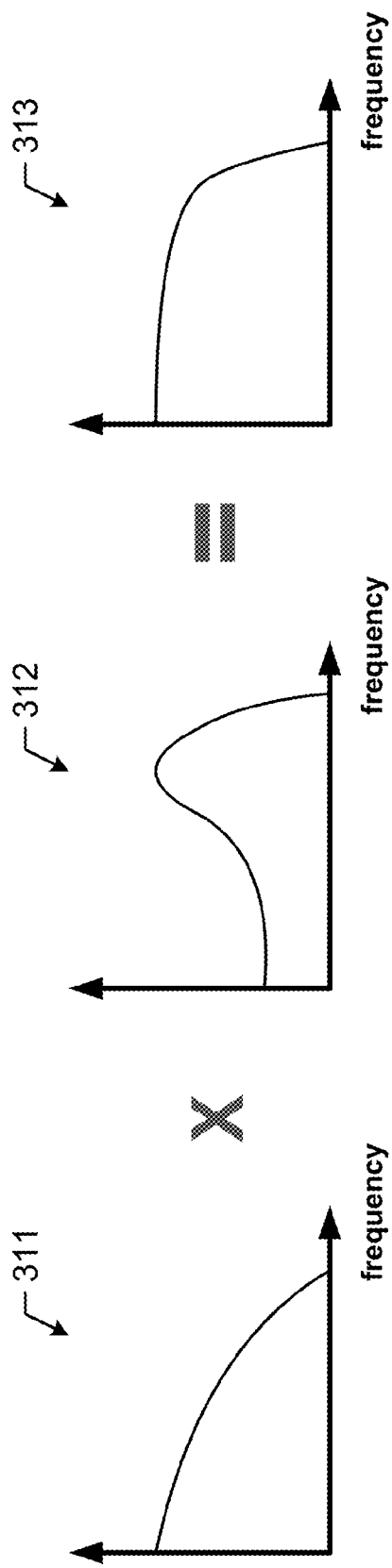
FIG. 3C illustrates an example frequency response of an optical link
Figure 3D:
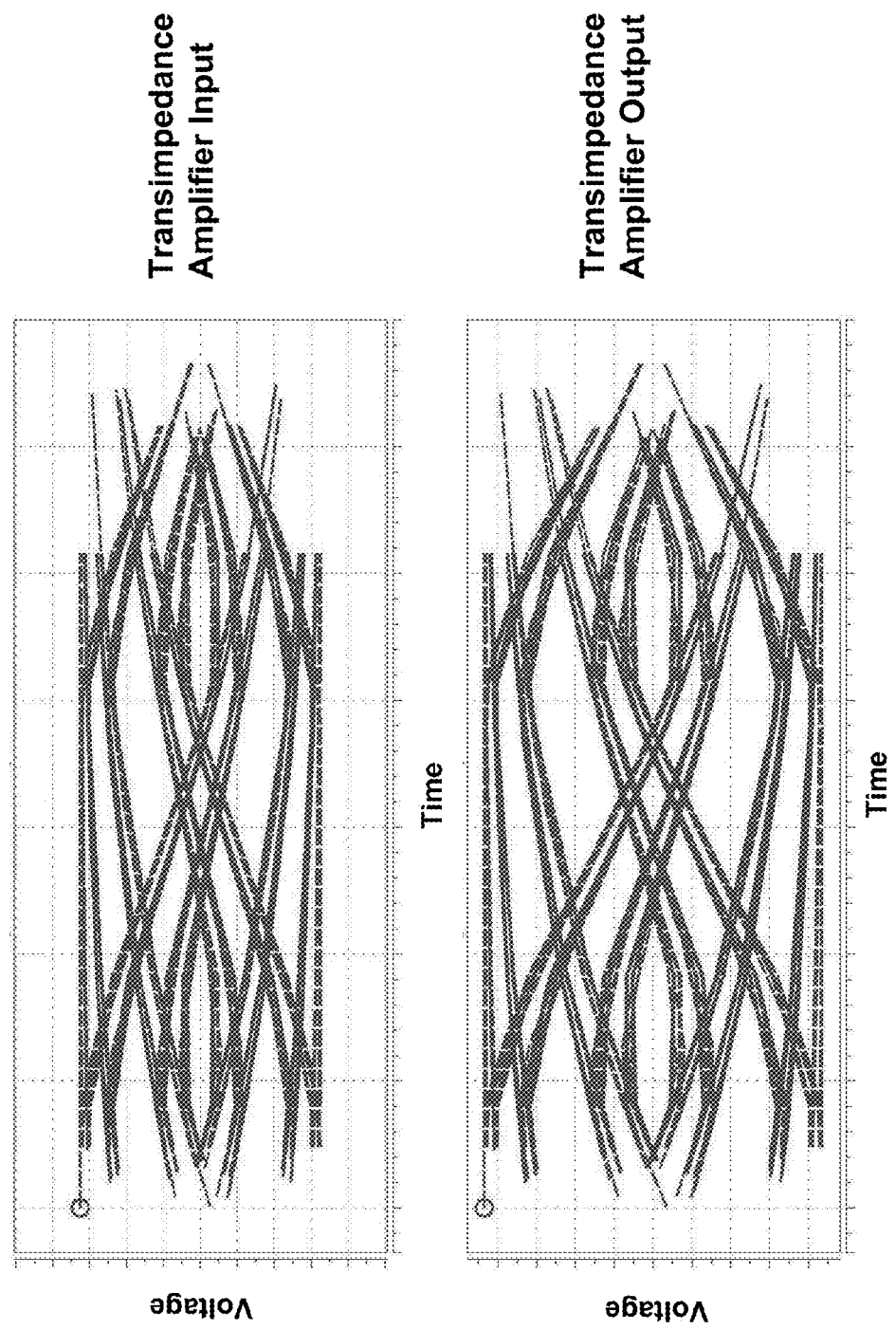
FIGS. 3D and 3E illustrate example eye diagrams.
Figure 3E:
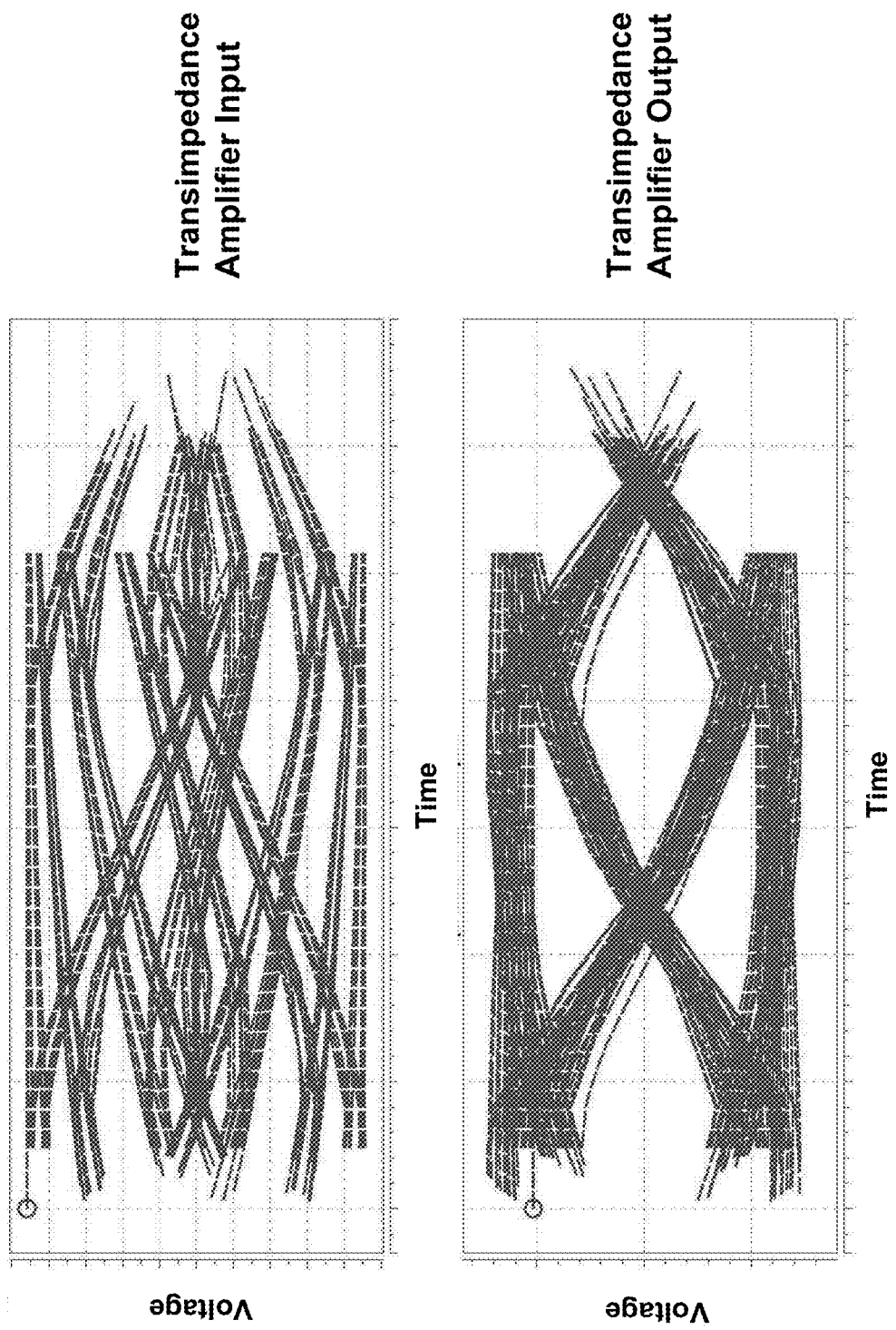

In particular embodiments, the gain peaking of the transfer function $Z_{TIA}(s)$ may provide equalization of the overall frequency response of optical link 100. FIG. 3C illustrates an example frequency response of optical link 100. In the example of FIG. 3C, optical link 100 before the transimpedance amplifier may demonstrate a low-pass characteristic in its frequency response (311 in FIG. 3C). Meanwhile, the transimpedance amplifier may have a transfer function $Z_{TIA}(s)$ with a gain peaking characteristic (312 in FIG. 3C). Thus the overall frequency response of optical link 100 (the product of frequency response 311 and transfer function 312) may demonstrate a substantially flat characteristic over a desired range of frequency (313 in FIG. 3C). That is, the equalization provided by the gain-peaking characteristic of the transimpedance amplifier may improve overall bandwidth of the optical link. Without equalization, a large amount of inter-symbol interference and jitter may be present at the output of the transimpedance amplifier, as illustrated by a "closed eye" in the eye diagram of FIG. 3D. With equalization by the transimpedance amplifier, inter-symbol interference and jitter may be reduced at the output of the transimpedance amplifier, as illustrated by an "open eye" in the eye diagram of FIG. 3E. By providing equalization with the transimpedance amplifier at the receiving end of optical link 100, particular embodiments may reduce effects of all bandwidth impairment preceding the receiving end. Furthermore, by providing equalization with the transimpedance amplifier, particular embodiments are more advantageous (e.g., reducing power consumption, cost and potentially circuit complexity) over receiver implementations that require a separate equalization component. This disclosure contemplates any suitable communication link (e.g., an electrically wired communication link, a wireless communication link) in which a transimpedance amplifier may apply equalization to reduce effects of bandwidth impairment.

FIGS. 4A-4F illustrate example implementations of a transimpedance amplifier with equalization. In the example of FIGS. 4A-4F, a degree of equalization (or gain peaking) provided by a transimpedance amplifier may be adapted for different communication link characteristics by adjusting one or more controllable (adjustable) elements of the transimpedance amplifier.

Figure 4A:
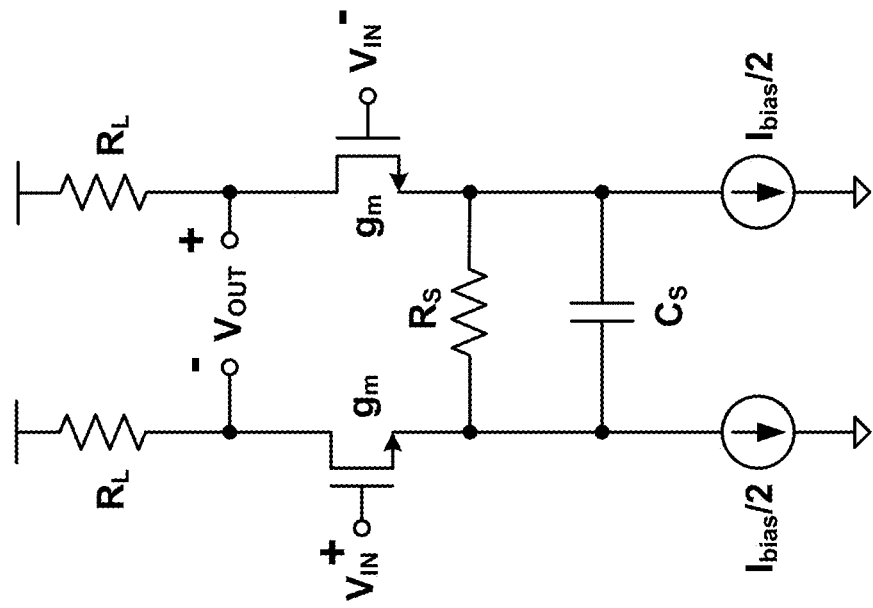
FIGS. 4A-4F illustrate example transimpedance amplifiers with equalization.
Figure 4A:
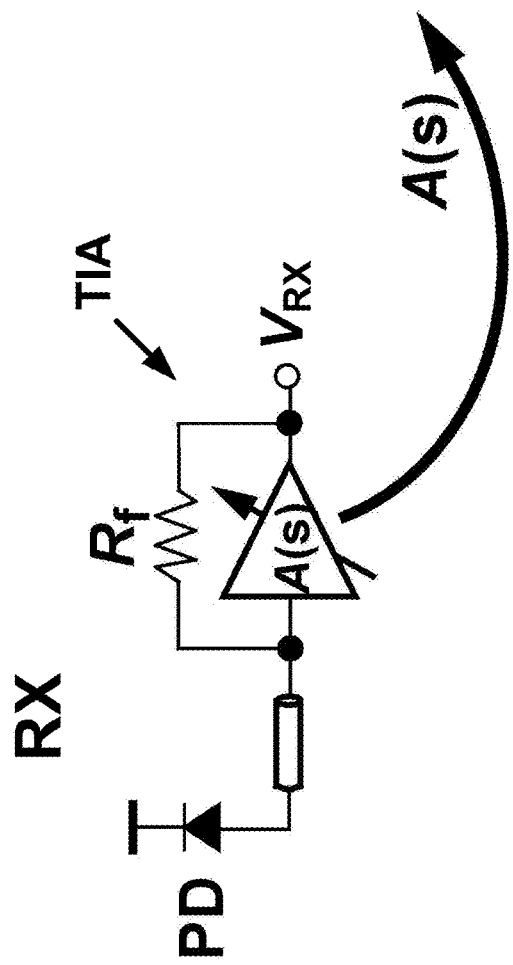

FIG. 4A illustrates an example transimpedance amplifier including a source-degenerated differential amplifier as its amplifier. In the example of FIG. 4A, a transimpedance amplifier (TIA) may comprise an amplifier and a feedback resistor $R_f$. The amplifier may comprise a source-degenerated differential amplifier, which amplifier gain A(s)

$$\left(\frac{V_{OUT}}{V_{IN}}\right)$$

may be represented in frequency domain by equation (1) described earlier. More specifically, the direct-current (DC) gain $A_0$ may be represented by equation (3) as following:

$$A_0 = \frac{-g_m R_L}{g_m R_S + 1} \approx -\frac{R_L}{R_S} \quad (3)$$

The zero frequency $\omega_Z$ may be represented by equation (4) as following:

$$\omega_Z = \frac{-1}{R_S C_S} \quad (4)$$

The respective frequencies of the first pole and the second pole may be represented by equations (5) and (6) as following:

$$\omega_{p1} = \frac{-1}{R_L C_L} \quad (5)$$

$$\omega_{p2} = -\frac{g_m R_S + 1}{R_S C_S} \approx \frac{-g_m}{C_S} \quad (6)$$

$C_L$ denotes a load capacitor for the TIA.

In other embodiments, the TIA illustrated in FIG. 4A may comprise a single-ended degenerated amplifier as its amplifier. For example, the TIA may comprise a single-ended NMOS degenerated amplifier as its amplifier. For another example, the TIA may comprise a single-ended PMOS degenerated amplifier as its amplifier.

Figure 4B:
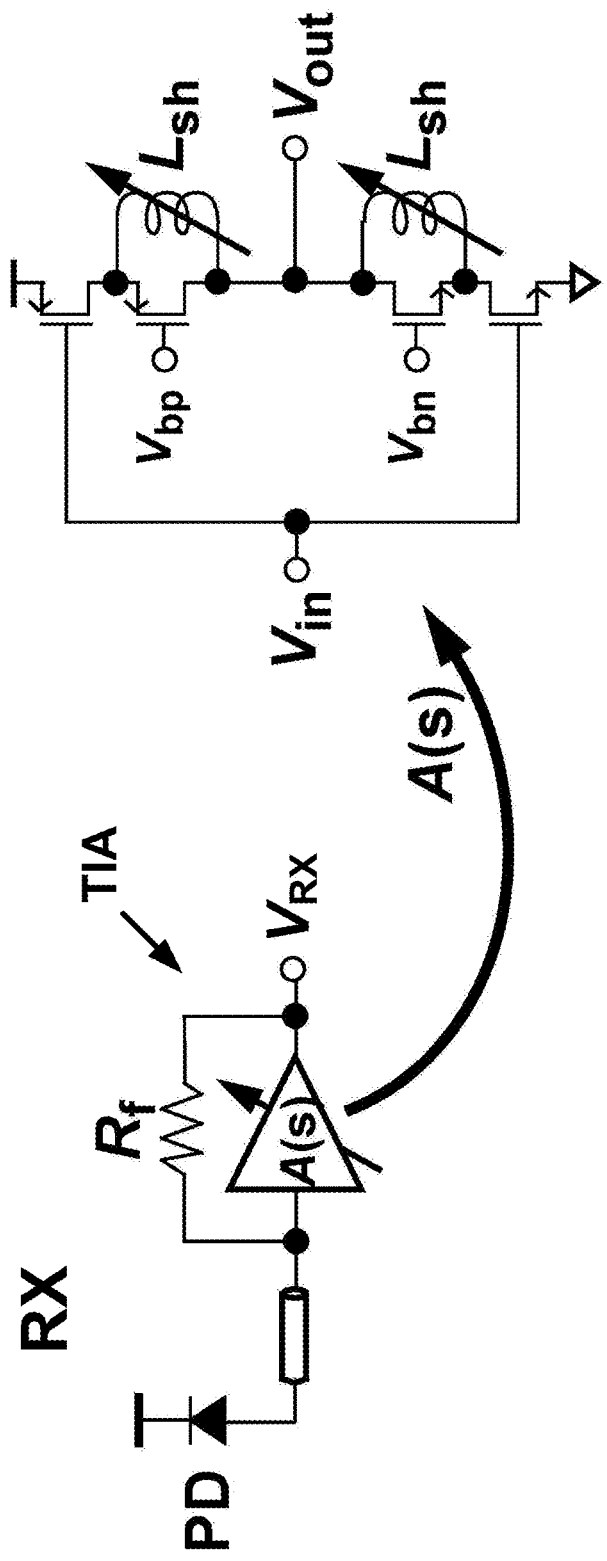

FIG. 4B illustrates an example transimpedance amplifier including a cascoded inverter with shunt inductors as its amplifier. In the example of FIG. 4B, a transimpedance amplifier (TIA) may comprise an amplifier and a feedback resistor $R_f$. The amplifier may comprise a cascoded inverter with which voltage gain is a function of two inductors $L_{sh}$. For example, at higher frequencies, $L_{sh}$ may act as open circuit, thus yielding higher amplifier gain. In contrast, at lower frequencies, $L_{sh}$ may act as short circuit, thus shorting the cascoded device and yielding lower amplifier gain. That is, the amplifier may provide equalization by providing gain peaking at higher frequency in frequency domain. A degree of equalization (and gain peaking) may be adjusted by adjusting inductance value of the two shunt inductors $L_{sh}$.

Figure 4C:
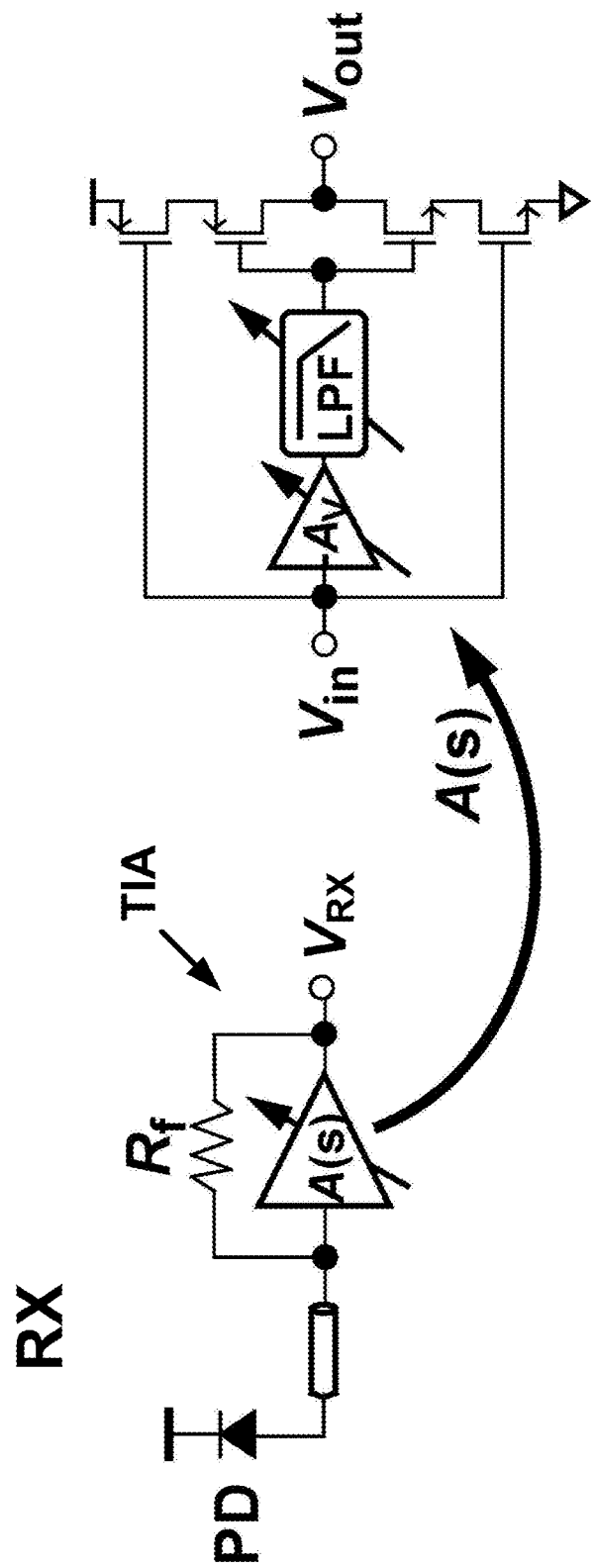

FIG. 4C illustrates an example transimpedance amplifier including a frequency-dependent cascoded inverter. In the example of FIG. 4C, a transimpedance amplifier (TIA) may comprise an amplifier and a feedback resistor $R_f$. The amplifier may comprise a cascoded inverter, a sub-amplifier ($A_V$), and a low-pass filter (LPF). The voltage gain of the cascoded inverter is frequency dependent. For example, at higher frequencies, the LPF may cause the cascoded inverter to be DC-biased, thus yielding higher voltage gain. In contrast, at lower frequencies, the voltage gain may be modulated with the inverse of an input signal, thus yielding lower voltage gain. That is, the amplifier may provide equalization by providing gain peaking at higher frequency in frequency domain. A degree of equalization (and gain peaking) may be adjusted by adjusting cut-off frequency of the LPF, or by adjusting the sub-amplifier's inversion gain.

Figure 4D:
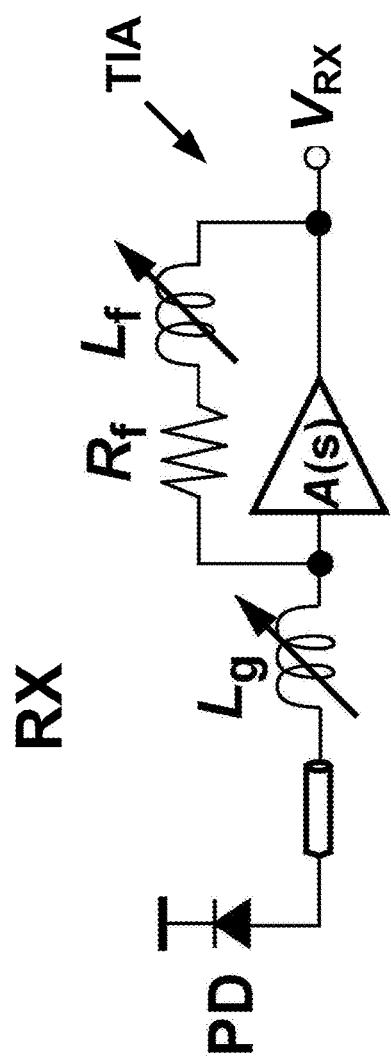

FIG. 4D illustrates another example transimpedance amplifier with equalization. In the example of FIG. 4D, a transimpedance amplifier (TIA) may comprise an amplifier (A(s)) and a feedback resistor $R_f$. The transimpedance amplifier may further comprise an inductor $L_f$ in series with the feedback resistor $R_f$. The series inductor $L_f$ may provide gain peaking and equalization in frequency domain. A degree of equalization (and gain peaking) may be adjusted by adjusting inductance value of the series inductor $L_f$. In another embodiment, the transimpedance amplifier may further comprise an inductor $L_g$ at the gate of the amplifier A(s) to provide adjustable equalization in frequency domain.

Figure 4E:
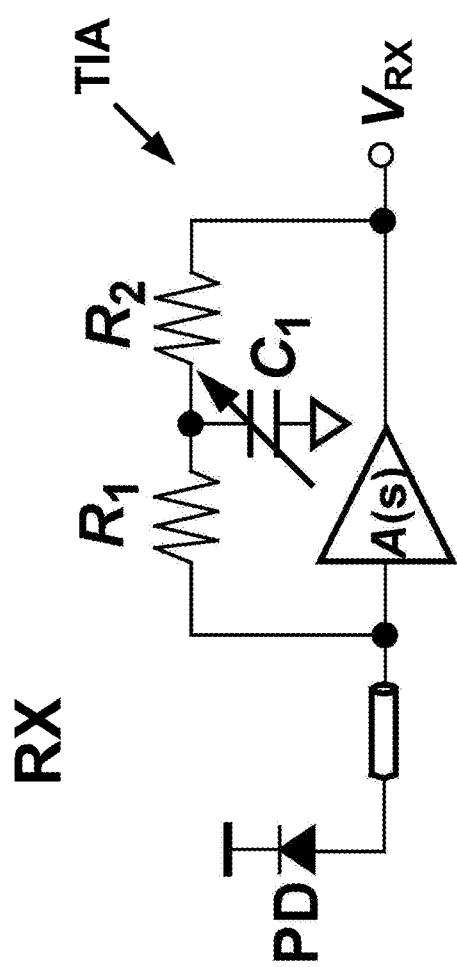

FIG. 4E illustrates an example transimpedance amplifier with a resistor-capacitor-resistor (RCR) T-network as its feedback network. In the example of FIG. 4E, a transimpedance amplifier (TIA) may comprise an amplifier (A(s)) and a feedback network, the feedback network comprising an RCR T-network. The RCR T-network may provide gain peaking and equalization in frequency domain. A degree of equalization (and gain peaking) may be adjusted by adjusting capacitance value of the capacitor ($C_1$) in the RCR T-network.

Figure 4F:
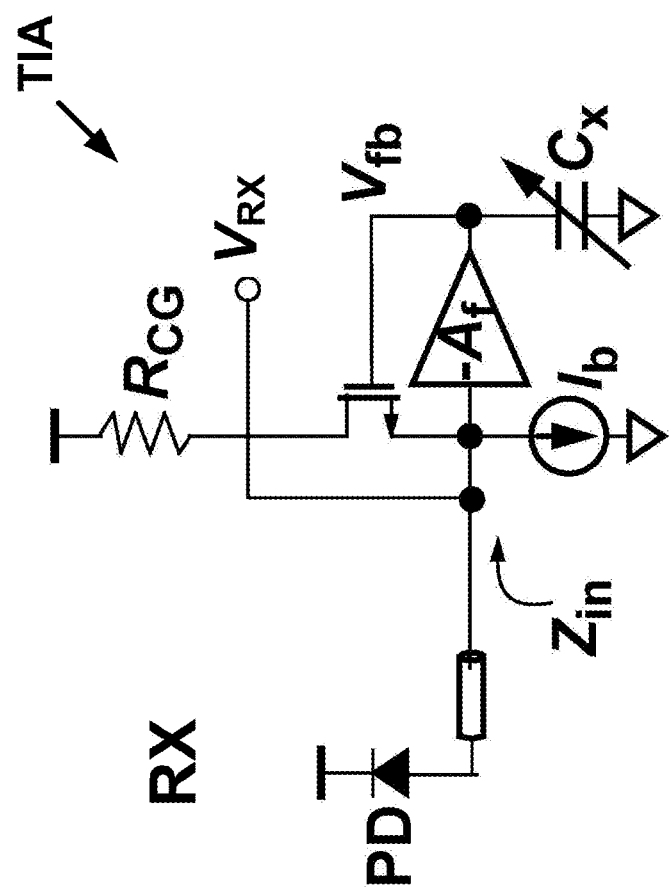

FIG. 4F illustrates an example transimpedance amplifier in regulated cascoded topology. In the example of FIG. 4F, a transimpedance amplifier (TIA) may comprise an amplifier ($A_f$), and the input node of the amplifier may provide the received signal $V_{RX}$ of optical link 100. The capacitance value of a capacitor $C_X$ may be adjusted to increase value in input impedance $Z_{in}$, thus yielding gain peaking (and equalization) in frequency domain for the transimpedance amplifier.

Figure 5:
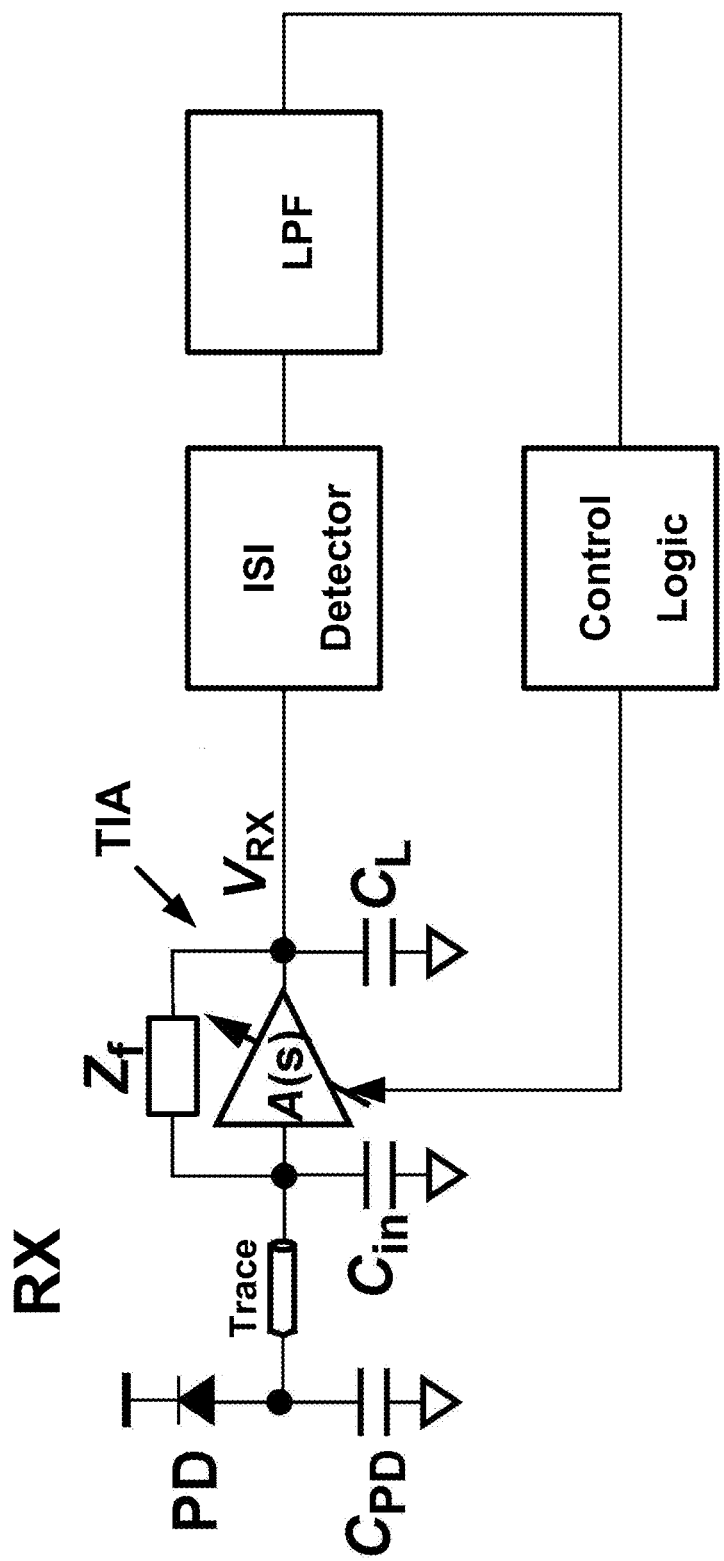
FIG. 5 illustrates an example feedback loop for controlling the degree of equalization of a transimpedance amplifier.

Particular embodiments may adapt the degree of equalization of a transimpedance amplifier based on inter-symbol interference (ISI) detected at the output of the transimpedance amplifier. FIG. 5 illustrates a feedback loop for controlling the degree of equalization of a transimpedance amplifier. In the example of FIG. 5, the feedback look may comprise an ISI detector and a low-pass filter (LPF). The ISI detector and the LPF at the output of a transimpedance amplifier may detect and determine an amount of inter-symbol interference at the output of the transimpedance amplifier (i.e., inter-symbol interference in the received signal $V_{RX}$ of optical link 100 illustrated in FIG. 1). A control logic may adjust the degree of equalization of the transimpedance amplifier to minimize the inter-symbol interference (detected at the output of the transimpedance amplifier) by adjusting one or more controllable elements of the transimpedance amplifier. For example, the control logic may adjust the voltage gain of the sub-amplifier ($A_V$) of the transimpedance amplifier (TIA) illustrated in FIG. 4B to adjust its degree of equalization (as described earlier).

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

This disclosure encompasses all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the invention and the concepts contributed by the inventor to furthering the art, and are to be construed as being without limitation to such specifically recited examples and conditions. Although the embodiment(s) of the present inventions have been described in detail, it should be understood that the various changes, substitutions, and alterations could be made hereto without departing from the spirit and scope of the invention.

What is claimed is:

1. A circuit comprising:
   transimpedance amplifier at a receiving end of a communication link, the transimpedance amplifier being configured to apply equalization to a signal carried by the communication link at the receiving end of the communication link, the transimpedance amplifier comprising:
      a first amplifier; and
      a feedback impedance;
   an inter-symbol interference detector configured to detect, at an output of the transimpedance amplifier, inter-symbol interference in the carried signal; and
   a control logic configured to cause the transimpedance amplifier to apply the equalization to the carried signal based at least in part on the detected inter-symbol interference.

2. The circuit of claim 1, wherein the first amplifier comprises a source-degenerated differential amplifier.

3. The circuit of claim 1, wherein the first amplifier comprises a cascoded inverter with adjustable shunt inductors.

4. The circuit of claim 1, wherein the first amplifier comprises:
   an adjustable sub-amplifier;
   an adjustable low-pass filter; and
   a cascoded inverter.

5. The circuit of claim 1, wherein the feedback impedance comprises a feedback resistor and a first adjustable feedback inductor.

6. The circuit of claim 5, further comprising a second adjustable inductor at the gate of the first amplifier.

7. The circuit of claim 1, wherein the feedback impedance comprises a resistor-capacitor-resistor (RCR) T-network, the RCR T-network including:
   a first resistor;
   a second resistor, the second resistor being coupled in series to the first resistor; and an adjustable capacitor, a first terminal of the adjustable capacitor being coupled between the first resistor and the second resistor, and a second terminal of the adjustable capacitor being coupled to a ground potential of the circuit.

8. The circuit of claim 3, wherein a degree of the equalization is determined based at least in part on an inductance of each adjustable shunt inductor.

9. The circuit of claim 4, wherein a gain of the first amplifier is determined based at least in part on:
   a cut-off frequency of the adjustable low-pass filter; or
   an inversion gain of the adjustable sub-amplifier.

10. The circuit of claim 4, wherein a degree of the equalization is determined based at least in part on:
    a cut-off frequency of the adjustable low-pass filter; or
    an inversion gain of the adjustable sub-amplifier.

11. A method comprising:
    applying, by a transimpedance amplifier at a receiving end of a communication link, equalization to a signal carried by the communication link at the receiving end of the communication link, the transimpedance amplifier comprising:
        a first amplifier; and
        a feedback impedance;
    detecting, by an inter-symbol interference detector, at an output of the transimpedance amplifier, inter-symbol interference in the carried signal; and
    causing, by a control logic, the transimpedance amplifier to apply the equalization to the carried signal based at least art on the detected inter-symbol interference.

12. The method of claim 11, wherein the first amplifier comprises a source-degenerated differential amplifier.

13. The method of claim 11, wherein the first amplifier comprises a cascoded inverter with adjustable shunt inductors.

14. The method of claim 11, wherein the first amplifier comprises:
    an adjustable sub-amplifier;
    an adjustable low-pass filter; and
    a cascoded inverter.

15. The method of claim 11, wherein the feedback impedance comprises a feedback resistor and a first adjustable feedback inductor.

16. The method of claim 15, wherein the first amplifier having a second adjustable inductor at the gate of the first amplifier.

17. The method of claim 11, wherein the feedback impedance comprises a resistor-capacitor-resistor (RCR) T-network, the RCR T-network including:
    a first resistor;
    a second resistor, the second resistor being coupled in series to the first resistor; and
    an adjustable capacitor, a first terminal of the adjustable capacitor being coupled between the first resistor and the second resistor, and a second terminal of the adjustable capacitor being coupled to a ground potential of the circuit.

18. The method of claim 13, further comprising:
    determining a degree of the equalization based at least in part on an inductance of each adjustable shunt inductor.

19. The method of claim 14, wherein a gain of the first amplifier is determined based at least in part on:
    a cut-off frequency of the adjustable low-pass filter; or
    an inversion gain of the adjustable sub-amplifier.

20. The method of claim 14, further comprising:
    determining a degree of the equalization based at least in part on:
        a cut-off frequency of the adjustable low-pass filter; or
        an inversion gain of the adjustable sub-amplifier.

* * * * *

UNITED STATES PATENT AND TRADEMARK OFFICE
CERTIFICATE OF CORRECTION

| | | |
|---|---|---|
| PATENT NO. | : 8,891,704 B2 | Page 1 of 1 |
| APPLICATION NO. | : 13/670219 | |
| DATED | : November 18, 2014 | |
| INVENTOR(S) | : McLeod et al. | |

It is certified that error appears in the above-identified patent and that said Letters Patent is hereby corrected as shown below:

In the claims:

Col. 7, Lines 29-30, Claim 11: After "carried signal based at least" and before "on the detected" delete "art" and insert -- in part --.

Signed and Sealed this
Thirty-first Day of March, 2015

Michelle K. Lee
*Director of the United States Patent and Trademark Office*